United States Patent
Jullian et al.

(10) Patent No.: US 11,658,133 B2
(45) Date of Patent: May 23, 2023

(54) INTEGRATED CIRCUIT DEVICE

(71) Applicant: Nagravision SA, Cheseaux-sur-Lausanne (CH)

(72) Inventors: Stephane Jullian, Cheseaux-sur-Lausanne (CH); Pascal Aubry, Cheseaux-sur-Lausanne (CH)

(73) Assignee: Nagravision SA, Cheseaux-sur-Lausanne (CH)

( * ) Notice: Subject to any disclaimer, the term of this patent is extended or adjusted under 35 U.S.C. 154(b) by 268 days.

(21) Appl. No.: 16/097,384

(22) PCT Filed: Apr. 27, 2017

(86) PCT No.: PCT/EP2017/060139
§ 371 (c)(1),
(2) Date: Oct. 29, 2018

(87) PCT Pub. No.: WO2017/186887
PCT Pub. Date: Nov. 2, 2017

(65) Prior Publication Data
US 2019/0148313 A1    May 16, 2019

(30) Foreign Application Priority Data
Apr. 29, 2016 (GB) .................................. 1607589

(51) Int. Cl.
*H01L 23/00* (2006.01)
(52) U.S. Cl.
CPC .......... *H01L 23/573* (2013.01); *H01L 23/576* (2013.01)
(58) Field of Classification Search
CPC ............................ H01L 23/573; H01L 23/576
See application file for complete search history.

(56) References Cited

U.S. PATENT DOCUMENTS 4,534,804 A * 8/1985 Cade ..................... H01L 21/268
257/620
4,862,240 A * 8/1989 Watanabe ......... H01L 21/76205
257/376

(Continued)

FOREIGN PATENT DOCUMENTS

DE        103 37 256 A1      6/2004

OTHER PUBLICATIONS

International Search Report and Written Opinion dated Jul. 21, 2017, in PCT/EP2017/060139 filed Apr. 27, 2017.

(Continued)

*Primary Examiner* — Duy T Nguyen
(74) *Attorney, Agent, or Firm* — Oblon, McClelland, Maier & Neustadt, L.L.P.

(57) ABSTRACT

An integrated circuit device is disclosed, the device comprising a protective layer and a protected circuit on a substrate, the protective layer being configured to protect the protected circuit by absorbing laser radiation targeted at the protected circuit through the substrate. The device may be configured such that removal of the protective layer causes physical damage that disables the protected circuit. The device may comprise intermediate circuitry protruding into the substrate between the protective layer and the protected circuit, wherein the physical damage that disables the protected circuit is physical damage to the intermediate circuitry. The device may comprise detection circuitry configured to detect a change in an electrical property of the device indicative of removal of the protective layer, and, in response to detecting the change in the electrical property, cause the protected circuit to be disabled.

14 Claims, 6 Drawing Sheets

(56) References Cited

U.S. PATENT DOCUMENTS

| | | | | |
|---|---|---|---|---|
| 5,154,946 | A * | 10/1992 | Zdebel | H01L 21/823878 257/370 |
| 7,847,581 | B2 * | 12/2010 | Lisart | H01L 23/576 326/101 |
| 7,999,358 | B2 * | 8/2011 | Bakalski | H01L 23/5225 257/508 |
| 8,513,782 | B2 * | 8/2013 | Bakalski | H01L 23/5225 257/508 |
| 9,070,697 | B2 * | 6/2015 | Marinet | H01L 29/7322 |
| 9,659,877 | B2 * | 5/2017 | Bakalski | H01L 23/5225 |
| 2002/0086472 | A1 * | 7/2002 | Roberds | H01L 29/1054 438/197 |
| 2002/0130248 | A1 * | 9/2002 | Bretschneider | G06K 19/073 250/214 R |
| 2006/0081912 | A1 * | 4/2006 | Wagner | G06K 19/07372 257/316 |
| 2009/0251168 | A1 * | 10/2009 | Lisart | H01L 23/576 326/8 |
| 2010/0187525 | A1 | 7/2010 | Bartley et al. | |
| 2010/0315108 | A1 * | 12/2010 | Fornara | G01L 9/0042 324/706 |
| 2010/0318885 | A1 * | 12/2010 | Lisart | G06F 11/1032 714/805 |
| 2011/0234307 | A1 * | 9/2011 | Marinet | G06F 21/72 327/538 |
| 2012/0320477 | A1 | 12/2012 | Lisart et al. | |
| 2012/0320480 | A1 * | 12/2012 | Lisart | H01L 21/763 361/88 |
| 2013/0075726 | A1 * | 3/2013 | Fornara | H01L 23/585 257/48 |
| 2013/0100559 | A1 * | 4/2013 | Kuenemund | H01L 23/544 361/42 |
| 2013/0181254 | A1 * | 7/2013 | Iwasaki | H01L 29/7393 257/140 |
| 2013/0231870 | A1 * | 9/2013 | Sugnet | G16B 40/00 702/19 |
| 2014/0111230 | A1 * | 4/2014 | Lisart | H01L 23/576 324/705 |
| 2015/0108606 | A1 | 4/2015 | Lamy et al. | |
| 2015/0364433 | A1 * | 12/2015 | Hindman | H01L 27/092 326/16 |
| 2016/0042199 | A1 | 2/2016 | Joharapurkar et al. | |
| 2016/0072621 | A1 * | 3/2016 | Oshida | H04L 9/002 713/194 |
| 2016/0307855 | A1 * | 10/2016 | Charbonnier | H01L 23/576 |
| 2017/0278839 | A1 * | 9/2017 | Lai | H01L 27/0262 |
| 2017/0301635 | A1 * | 10/2017 | Sarafianos | H01L 21/762 |
| 2018/0233460 | A1 * | 8/2018 | Lisart | H01L 23/573 |
| 2019/0148313 | A1 * | 5/2019 | Jullian | H01L 23/576 257/499 |

OTHER PUBLICATIONS

Singapore Written Opinion dated Nov. 5, 2019, in Application No. 11201808897U, 7 pages.

European Office Action dated Apr. 23, 2020 in European Patent Application No. 17721594.4, 6 pages.

Invitation to Respond to Written Opinion dated Oct. 1, 2020 in Singapore Patent Application No. 11201808897U.

Written Opinion dated Sep. 24, 2020 in Singapore Patent Application No. 11201808897U.

Written Opinion dated Oct. 8, 2021 in Singaporean Patent Application No. 11201808897 U, 6 pages.

Office Action dated Jun. 22, 2022 in Chinese Application No. 201780039918.9 (with partial English Translation).

Chinese Office Action dated Dec. 8, 2021 in Chinese Application No. 201780039918.9 (with Computer Generated English Translation).

Preliminary Examination Report dated Jun. 14, 2022 in Brazilian Patent Application No. 112018071175-6, 4 pages.

* cited by examiner

INTEGRATED CIRCUIT DEVICE

FIELD

This disclosure relates to an integrated circuit device, in particular to protecting such a device from a laser attack.

BACKGROUND

It is known in the art of integrated circuit devices that an attack on such an integrated circuit device can be carried out using a laser. Radiation from the laser can be used, for example, to switch on a transistor within a circuit of the integrated circuit device to alter the running of the device. Such an attack can be used to circumvent security measures of the device.

Typical integrated circuit devices have a substrate layer of silicon, which is typically 120 to 800 μm thick. Some attackers reduce this thickness by mechanical means, such as polishing, or using a chemical. The chemical may be a liquid such as tetramethylammonium hydroxide TMAH, Potassium Hydroxide KOH, ethylenediamine pyrocatechol EDP, or an acid mix (hydrofluoric, nitric, acetic). Alternatively, the chemical may be a gas such as carbon tetrachloride CCl4. With a reduced thickness of the substrate layer, a laser attack can be made more easily through the remainder of this layer.

Overview

An invention is set out in claim 1. Optional features are set out in the dependent claims.

In an aspect, there is provided an integrated circuit device comprising: a protective layer; and a protected circuit on a substrate. The protective layer is configured to protect the protected circuit by absorbing laser radiation targeted at the protected circuit through the substrate.

In an aspect, there is provided an integrated circuit device having a front surface and a back surface. The device comprises a protected circuit and a protective layer between the protected circuit and the back surface of the device. The protective layer is configured to absorb laser radiation arriving from the back surface of the device, thereby protecting the protected circuit from the laser radiation.

In an aspect, there is provided an integrated circuit device comprising: a protected circuit on a substrate; and detection circuitry configured to detect a change in an electrical property of the device indicative of removal of material from the substrate, and, in response to detecting the change in the electrical property, cause the protected circuit to be disabled.

In an aspect, there is provided an integrated circuit device comprising: a protected circuit on a substrate; and intermediate circuitry protruding into the substrate, the device being configured such that removal of material from the substrate causes physical damage that disables the protected circuit, wherein the physical damage that disables the protected circuit is physical damage to the intermediate circuitry.

In some embodiments, the device is configured such that removal of the protective layer causes physical damage that disables the protected circuit. In some embodiments, the device comprises intermediate circuitry protruding into the substrate between the protective layer and the protected circuit, wherein the physical damage that disables the protected circuit is physical damage to the intermediate circuitry.

In some embodiments, the device comprises detection circuitry configured to detect a change in an electrical property of the device indicative of removal of the protective layer, and, in response to detecting the change in the electrical property, cause the protected circuit to be disabled. In some embodiments, the electrical property is capacitance. In some embodiments, the detection circuitry comprises a DRAM cell or a bipolar transistor. In some embodiments, the detection circuitry comprises intermediate detection circuitry protruding into the substrate layer between the protective layer and the protected circuit.

In some embodiments, the protective layer comprises a doped semiconductor. In some embodiments, the doped semiconductor has a dopant concentration of at least $10^{19}$ cm$^{-3}$, $10^{20}$ cm$^{-3}$, $5\times10^{20}$ cm$^{-3}$ or $10^{21}$ cm$^{-3}$. In some embodiments, the protective layer has a transmittance of the laser radiation that is less than or equal to 40%, 20%, 15%, 10%, 5%, or 2%. In some embodiments, the laser radiation is infra-red radiation. In some embodiments, the protective layer is within the substrate. In some embodiments, the protective layer has a transmittance of the laser radiation that is less than a transmittance of the laser radiation of the substrate.

The disclosed device may therefore protect a circuit of the integrated circuit device from a laser attack. The protective layer may provide protection by absorbing a substantial amount of the laser radiation, such that this laser radiation does not reach the circuit. The laser attack is thereby prevented from achieving its purpose of attacking the device by manipulating the operation of the circuit.

The disclosed device may be able to withstand an attack involving tampering of the back side of the device by removing material from the back surface of the device. Before enough material is removed for a laser attack to become possible, the device may disable the circuit to be protected, thereby ensuring that a laser attack cannot succeed.

BRIEF DESCRIPTION OF THE DRAWINGS

Specific embodiments illustrating aspects of the disclosure are now described by way of example with reference to the accompanying drawings, in which.

DETAILED DESCRIPTION OF THE DRAWINGS

Figure 1:
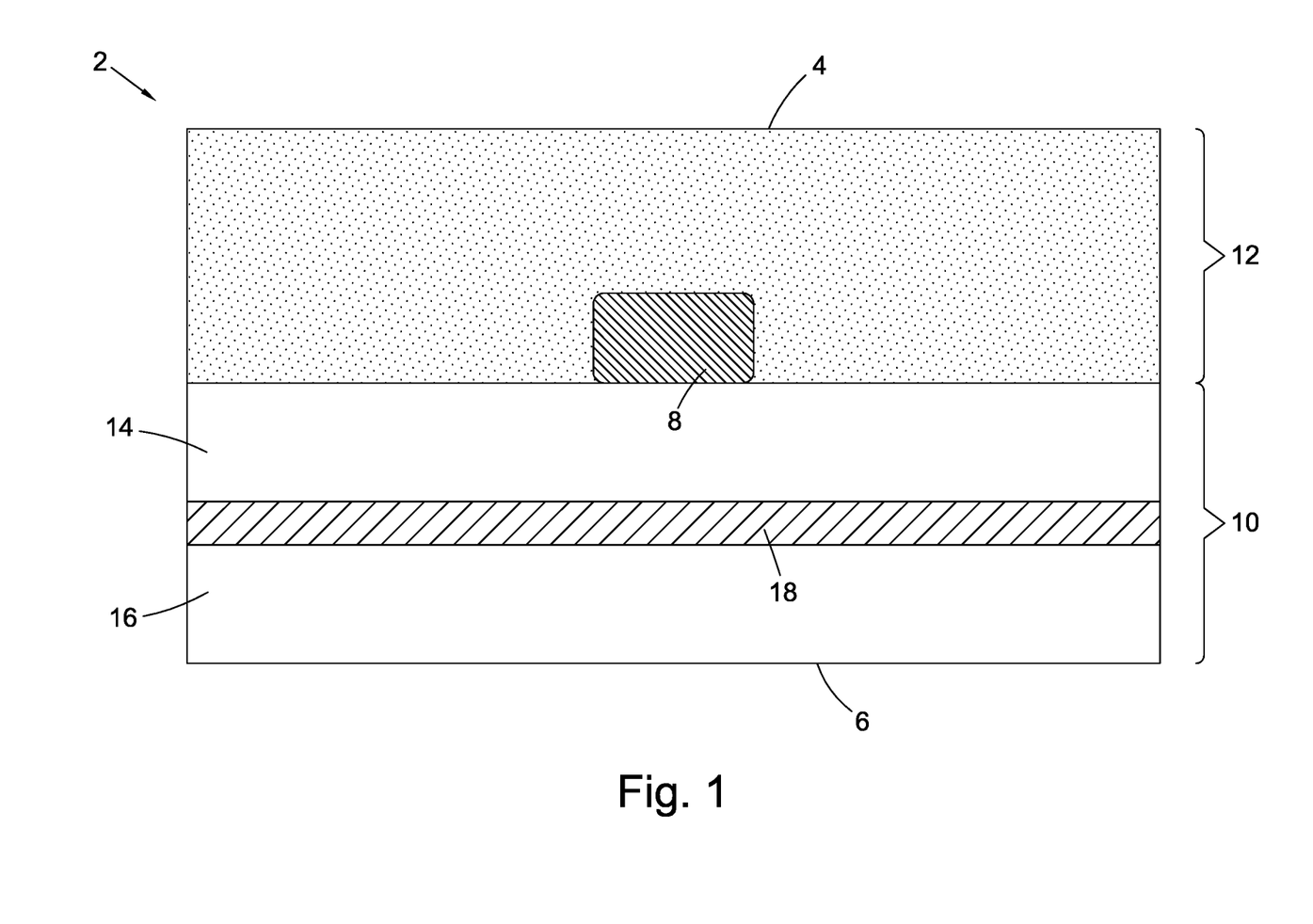
FIG. 1 depicts a cross-section view of a first embodiment of an integrated circuit device.

With reference to FIG. 1, a first embodiment of an integrated circuit device 2 (shown in cross-section) has a front surface 4 and a back surface 6 opposite the front surface. A front side and a back side of the integrated circuit device are situated between the front surface 4 and the back surface 6. The back side comprises a substrate. Circuits are formed on the substrate. The front side comprises metal layers. The back side of the integrated circuit device 2 is adjacent the back surface 6, and the front side of the integrated circuit device is 2 adjacent the front surface 4. The front side is between the front surface 4 and the circuits formed on the substrate. The back side is between the back surface 6 and the circuits formed on the substrate.

It has been identified that laser attacks may be carried out by directing laser radiation at the back surface 6 of the device 2. The laser radiation passes through the substrate and interacts with one or more of the circuits on the substrate (on the far side of the substrate with respect to the path of the laser radiation). Due to the presence of the metal layers between the circuits and the front surface of the device, a laser attack through the front surface 4 of the device 2 is not usually possible, as the metal layers would absorb the laser beam radiation.

A protected circuit 8 is situated inside the integrated circuit device 2 between the front surface 4 and the back surface 6. The region of the integrated circuit device 2 between the protected circuit 8 and the back surface 6 is referred to as the back portion 10. The remaining region of the integrated circuit device 2, including the protected circuit 8 and extending to the front surface 4, is referred to as the front portion 12.

The front portion 12 is structured in the conventional manner for an integrated circuit device 2. The back portion 10 comprises a substrate with which the protected circuit 8 is integrated. The back portion comprises an inner substrate layer 14, an outer substrate layer 16, and a protective layer 18 between the inner substrate layer 14 and the outer substrate layer 16. The protective layer 18 is between the protected circuit 8 and the back surface 6. The inner substrate layer 14 comprises the substrate with which the protected circuit 8 is integrated. In this embodiment, the (bulk) substrate comprises silicon. The outer substrate layer 16 has a similar composition to the inner substrate layer 14.

The protective layer 18 is configured to absorb laser radiation of a predetermined wavelength or wavelength range. In this embodiment, the predetermined wavelength is 1064 nm, corresponding to a standard infra-red diode laser. The wavelength or wavelength range is predetermined by the designer of the integrated circuit device 2 and is based on an anticipated wavelength or wavelength range of a laser attack by an attacker. The protective layer 18 has a transmittance of this laser radiation that is substantially lower than the transmittance of this laser radiation of the outer substrate layer and the inner substrate layer. The protective layer 18 comprises a doped semiconductor. In this embodiment, the protective layer 18 comprises silicon doped with phosphorous (N-type). The silicon is doped at a sufficiently high concentration to absorb a desired percentage of the laser radiation.

An approximated value for the transmission through the substrate is given by the formula: $T=(1-R)^2 e^{\alpha d}$, where R is the surface reflectivity, $\alpha$ the absorption coefficient and d the material thickness (in cm). The absorption coefficient $\alpha$ depends on the dopant type and concentration. For N-type doped silicon, with a dopant concentration of $5 \times 10^{20}$ cm$^{-3}$ and a negligible surface reflectivity (R~0), transmission at 1064 nm is roughly equal to $T=e^{2000d}$. For a layer thickness of 20 μm, transmission is only 2%. Such a layer absorbs most of the energy from the incident radiation, blocking infra-red imaging and laser fault injection, thereby protecting the protected circuit from an attack. Alternatively, if the dopant concentration of the above example is instead $10^{20}$ cm$^{-3}$ and the other parameters are the same, transmission is 20%. As a further alternative, if the dopant concentration of the above example is instead $10^{21}$ cm$^{-3}$, the layer thickness is instead 5 μm, and the other parameters are the same, transmission is 5%. Other possible layer thicknesses include 10 μm or 15 μm, or any other suitable thickness.

The parameters of the protective layer 18 are configured to ensure that the transmittance of the laser radiation through the protective layer 18 is equal to or less than a desired value. This desired value is, for example, 40%, 20%, 15%, 10%, 5%, or 2%. The parameters of the protective layer 18 available to be configured in order to ensure that the protective layer 18 achieves the desired value of transmittance include (as referred to above): the thickness of the protective layer 18 in a direction perpendicular to the back surface 6, the dopant concentration of the doped semiconductor, and the surface reflectivity of the protective layer 18. The protective layer 18 is opaque to the laser radiation.

The protective layer 18 has a sufficient extent in directions parallel to the back surface 6 to ensure that the protected circuit 8 is protected from laser radiation entering the integrated circuit device 2 through the back surface 6. Such a laser attack may occur at an angle perpendicular to the back surface 6, and also may occur at an angle offset from perpendicular. In this embodiment, the protective layer 18 extends across the full extent of the integrated circuit device 2 in directions parallel to the back surface 6. The extent of the protective layer 18 in directions parallel to the back surface 6 corresponds to the extent of the inner substrate layer 14 and the outer substrate layer 16 in the directions parallel to the back surface 6.

The heavily doped protective layer 18 therefore acts as a shield or a screen for the protected circuit 8, protecting the protected circuit 8 from incoming laser radiation arriving from the back surface 6 of the integrated circuit device 2.

Figure 2:
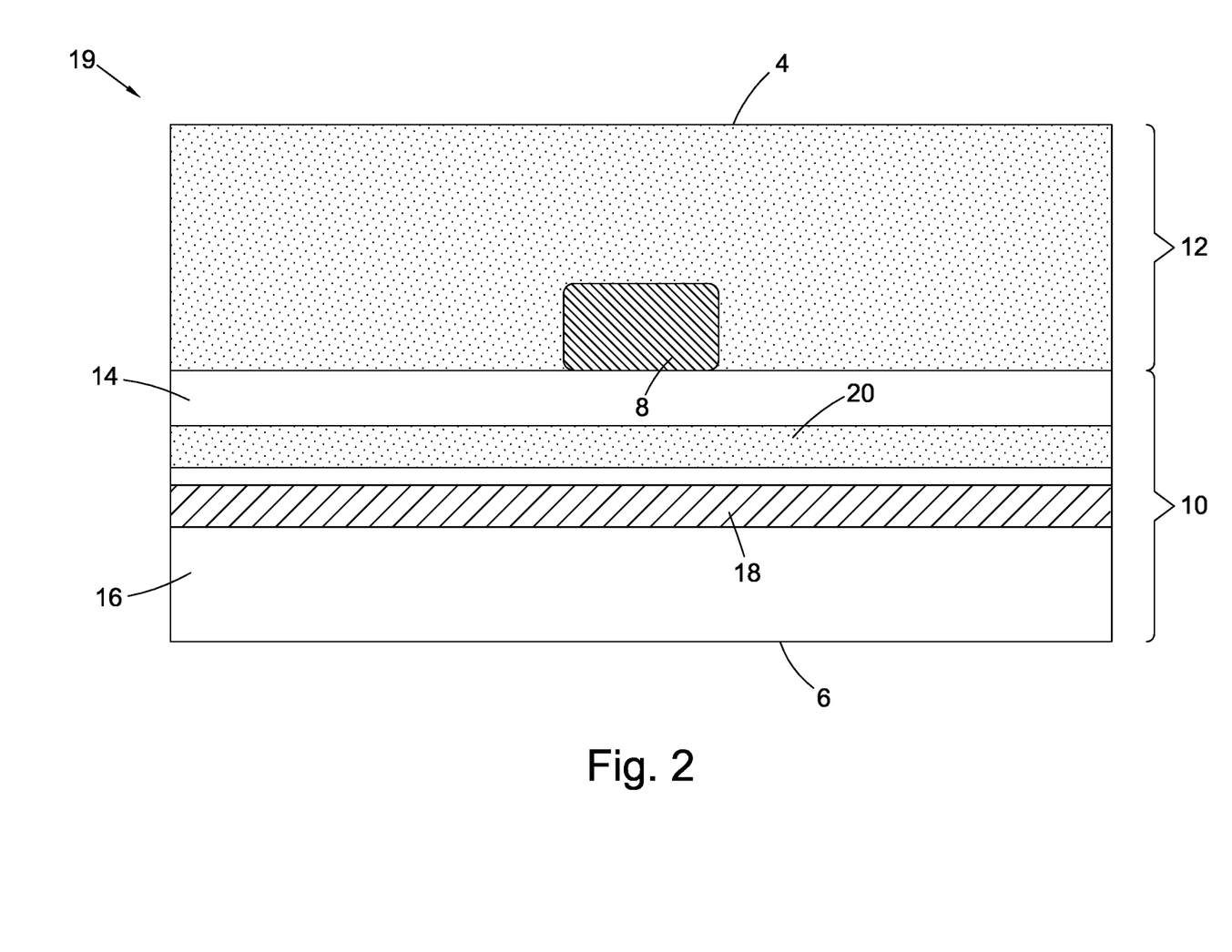
FIG. 2 depicts a cross-section view of a second embodiment of an integrated circuit device.

With reference to FIG. 2, a second embodiment of an integrated circuit device 19 is described. For this embodiment and the embodiments described below, the same reference numbers are used in the figures for features that correspond to those described in earlier embodiments. The second embodiment corresponds to the first embodiment (described with respect to FIG. 1), with the addition of an insulating layer 20 situated within the inner substrate layer 14 between the protective layer 18 and the protected circuit 8. The insulating layer 20 is configured to electrically insulate structures in the integrated circuit device 19. In this embodiment, the insulating layer 20 comprises silicon oxide. The insulating layer 20 is used for silicon on insulator (SOI) technology. The insulating layer 20 electrically separates a thin film of silicon (or other suitable material) from the wafer bulk. In that case, all process operations can be performed on a standard wafer (also for handling), but the electrical behaviour of the transistors is determined by the thin film properties. Generally, SOI transistors have several advantages over non-SOI configurations, including performance, yield, and resistance to certain parasitic effects.

Figure 3:
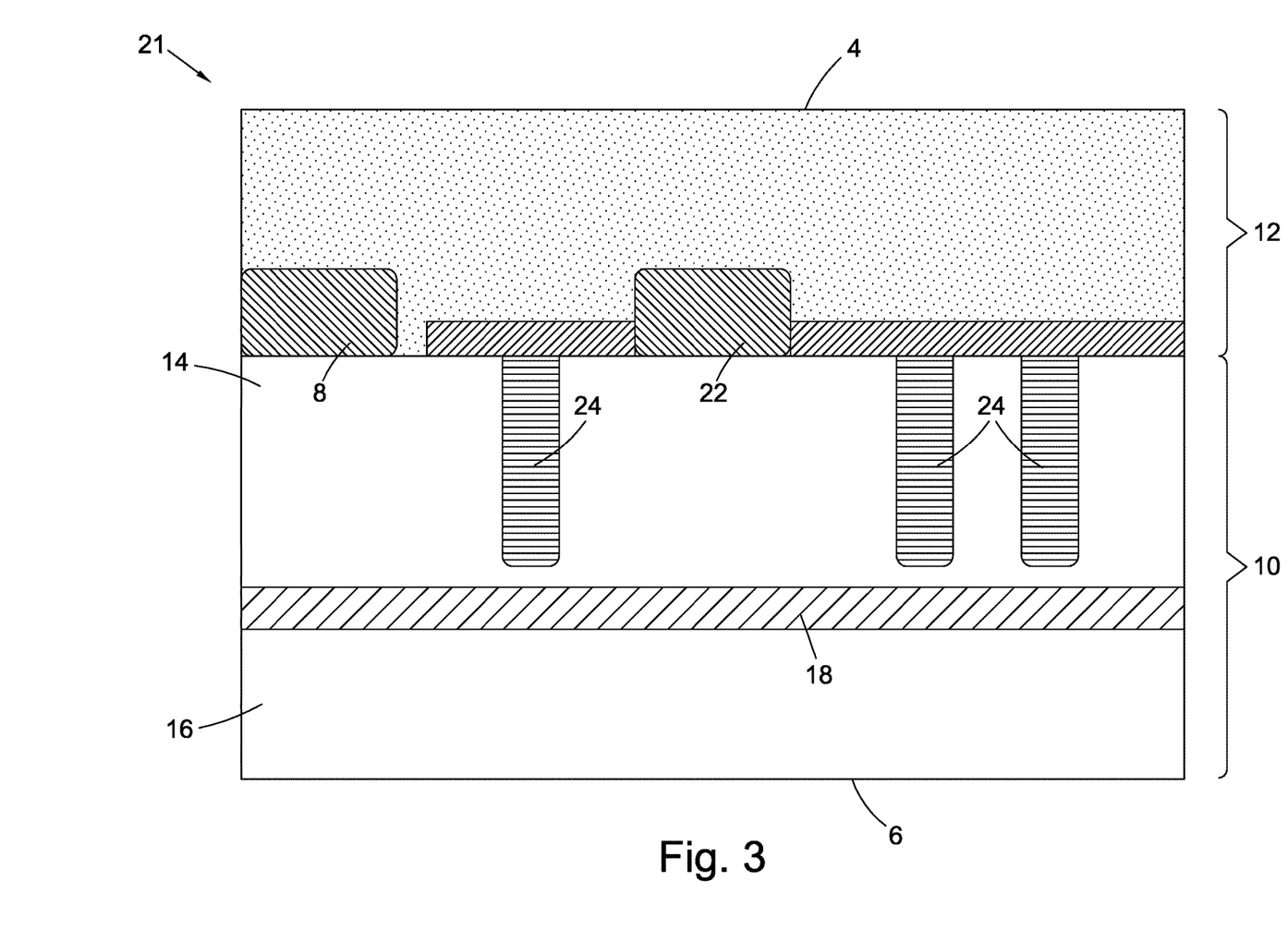
FIG. 3 depicts a cross-section view of a third embodiment of an integrated circuit device.

With reference to FIG. 3, a third embodiment of an integrated circuit device 21 is described. This embodiment corresponds to the first embodiment (described with respect to FIG. 1), with the addition of detection circuitry 22 and intermediate circuitry 24.

The detection circuitry 22 is in the same layer of the integrated circuit device 21 as the protected circuit 8. The intermediate circuitry 24 is in the inner substrate layer 14. The intermediate circuitry 24 is between the detection circuitry 22 and the protective layer 18, and between the protected circuit 8 and the protective layer 18. The intermediate circuitry 24 is situated in trenches within the inner substrate layer 14. In this embodiment, the intermediate circuitry 24 comprises a plurality of DRAM cells (three are shown in FIG. 3). The intermediate circuitry 24 extends closer towards the protective layer 18 than the distance between the protected circuit 8 and the protective layer 18.

The detection circuitry 22 is in electric communication with the intermediate circuitry 24. The detection circuitry 22 is configured to detect a change in an electrical property of the intermediate circuitry 24. In this embodiment, the electrical property is the capacitance of a capacitive component of the intermediate circuitry 24.

If an attacker removes material from the back portion 10 of the integrated circuit device 21 (for example, by polishing the back surface 6 of the integrated circuit device 21), this will affect the capacitance detected by the detection circuitry 22. Removal of the protective layer 18 by an attacker brings about such a change in capacitance. The removal of further material from the inner substrate layer 14 causes part of the intermediate circuitry 24 to be removed, due to the proximity of the intermediate circuitry 24 to the protective layer 18. The removal of part of the intermediate circuitry 24 causes the detected capacitance to change.

In response to detecting the change in the capacitance, the detection circuitry 22 sends a signal that causes the protected circuit 8 to be disabled. The protected circuit 8 is disabled by having its memory erased. This ensures that, if enough material is removed from the back side of the integrated circuit device 21 for a laser attack on the protected circuit 8 to become feasible, the protected circuit 8 will have already been disabled as a result of the removal of the material, before a laser attack can take place.

Figure 4:
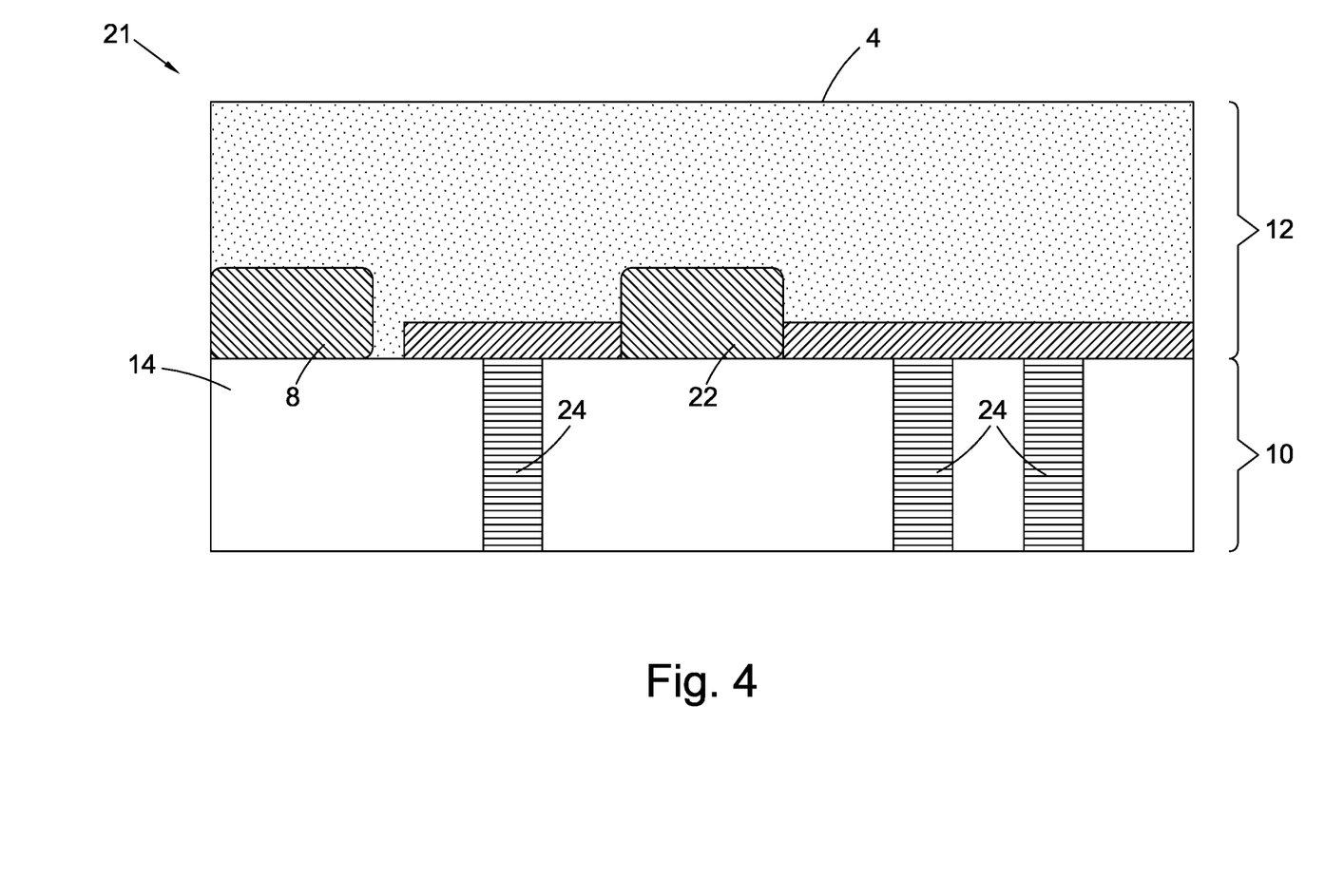
FIG. 4 depicts a cross-section view of the third embodiment of the integrated circuit device, having had material removed from a back portion of the device.

FIG. 4 depicts an illustration of the third embodiment of the integrated circuit device 21, with material having been removed from the back side, thereby removing the protective layer 18 and part of the intermediate circuitry 24.

Figure 5:
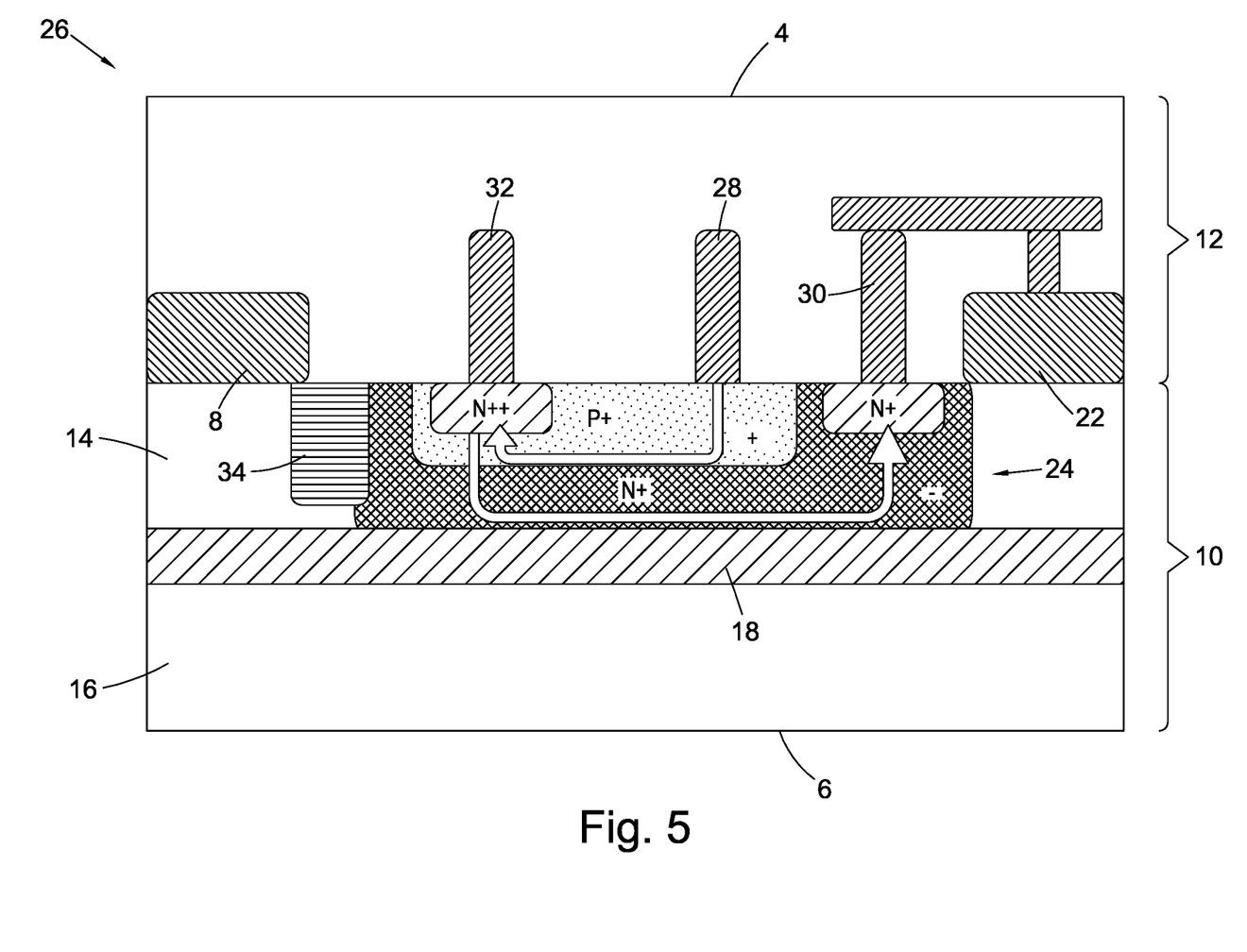
FIG. 5 depicts a cross-section view of a fourth embodiment of an integrated circuit device.

With reference to FIG. 5, a fourth embodiment of an integrated circuit device 26 is described. This embodiment has features corresponding to the first embodiment (described with respect to FIG. 1) and has similarities with the third embodiment (described with respect to FIG. 3). However, in this embodiment, instead of the intermediate circuitry 24 being a plurality of DRAM cells, the intermediate circuitry 24 is a bipolar transistor (also known as a bipolar junction transistor (BJT)). The bipolar transistor comprises a base 28, a collector 30, and an emitter 32. The base 28, the collector 30 and the emitter 32 extend into the front portion 12 of the integrated circuit device 26. The collector 30 is in electronic communication with the detection circuitry 22. The arrows in FIG. 5 represent the flow of the associated charge carrier. In an NPN transistor under operation, electrons (−) travel from the emitter 32 to the collector 30, while holes (+) travel from the base 28 to the emitter 32. When the device is operating, an electron current passes through the base 28 between the emitter 32 and the collector 30.

An STI (Shallow Trench Isolation) 34 is also provided in the inner substrate layer. The STI 34 is a trench etched in the silicon bulk and filled with oxide. The STI 34 is configured to insulate parts with different electrical domains from each other. The STI 34 is configured to prevent current from flowing from the emitter to an adjacent circuit.

Figure 6:
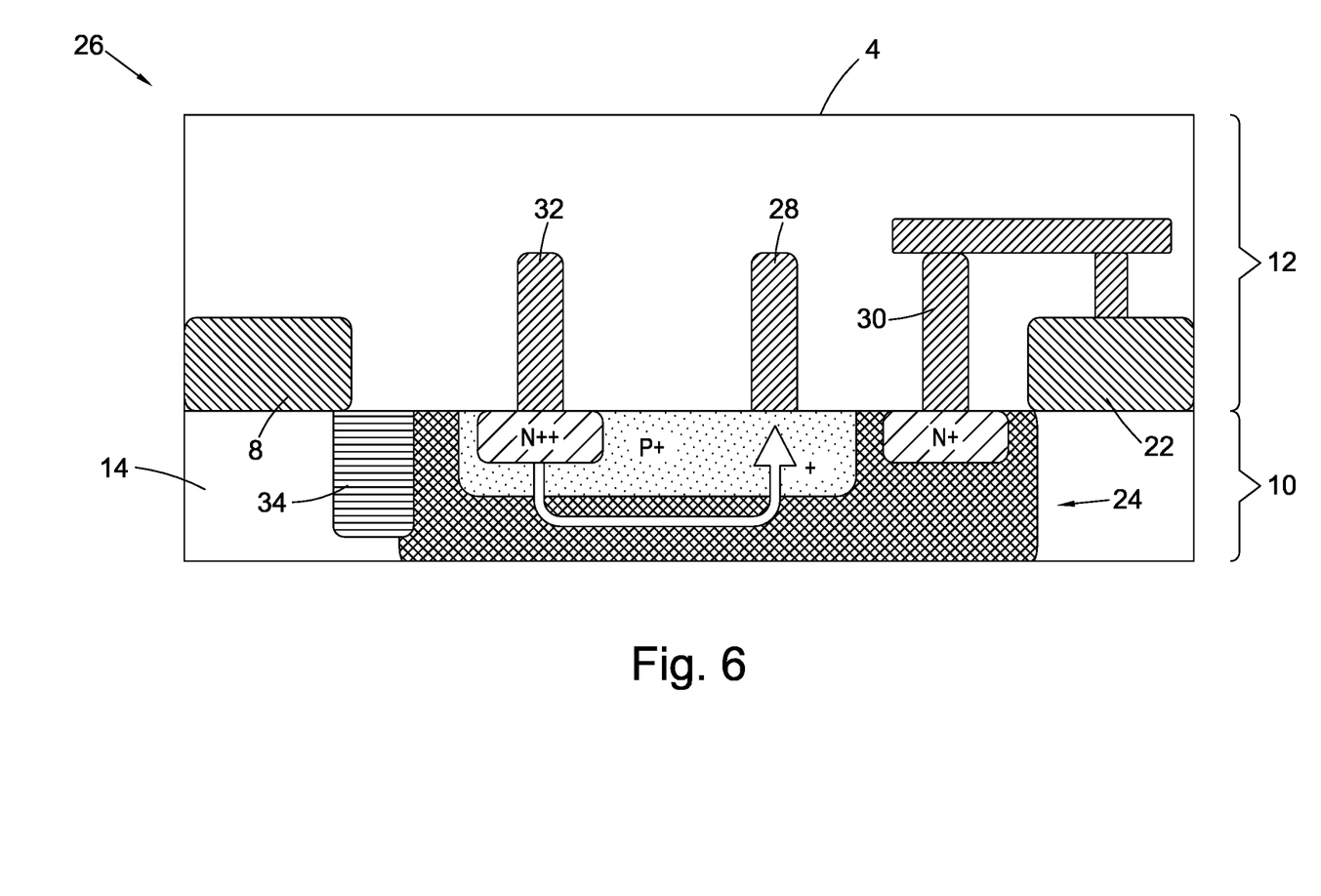
FIG. 6 depicts a cross-section view of the fourth embodiment of the integrated circuit device, having had material removed from a back portion of the device.

FIG. 6 shows the integrated circuit device 26 of the fourth embodiment, having had material removed from its back portion 10, such that the outer substrate layer 16 and the protective layer 18 are no longer present. In this situation, the bipolar transistor functions differently. The situation is that the conducting layer to the collector 30 has been removed such that no current can be established between the emitter 32 and the collector 30. The bipolar transistor has therefore been disabled; it does not function any more.

The change in functioning of the bipolar transistor caused by the removal of material from the back side of the integrated circuit device 26 is detected by the detection circuitry 22 due to the connection between the detection circuitry 22 and the collector 30 of the bipolar transistor. The detected change in functioning of the bipolar transistor may be that the bipolar transistor is no longer properly conducting. In response to the detected change in functioning, the detection circuitry 22 proceeds in the same manner as described above for the third embodiment (described with respect to FIG. 3).

Construction of the integrated circuit device 2, 19, 21, 26 involves standard manufacturing techniques known in the art. Before construction, parameters including those referred to above are determined such that the integrated circuit device 2, 19, 21, 26 will achieve functionality desired by the designer of the device. For example, the wavelength or wavelength range of the laser anticipated to carry out the attack is determined, and the concentration of the doped silicon is set at a sufficiently high concentration to absorb at least the desired percentage of the laser radiation.

It will be understood that the above description of specific embodiments is by way of example only and is not intended to limit the scope of the present disclosure. Many modifications of the described embodiments, some of which are now described, are envisaged and intended to be within the scope of the present disclosure.

In some embodiments, the integrated circuit device is configured in a manner similar to the third and fourth embodiments (described above with respect to FIGS. 3 to 6), but without the protective layer. The intermediate circuitry continues to be involved in the detection of tampering of the integrated circuit device by removal of material from the back portion.

In some embodiments, the detection circuitry is not present. Instead, the intermediate circuitry is integrally linked with, or is part of, the protected circuit, such that physical damage to the intermediate circuitry inherently causes the protected circuit no longer to function due, for example, to a connection being broken. The physical damage may be removal or attempted removal of the intermediate circuitry.

In some embodiments, the protected circuit is disabled in other manners than that described above. In some embodiments similar to the fourth embodiment (described with respect to FIGS. 5 and 6), the intermediate circuitry comprises a plurality of bipolar transistors. In some embodiments, the intermediate circuitry is formed of other components, or is replaced with other components, such as implanted layers, buried capacitances (DRAM), or through silicon vias (TSV).

In some embodiments, the protective layer does not extend in directions parallel to the back surface as far as other parts of the back portion (such as the inner substrate layer).

In some embodiments, the integrated circuit device is a bipolar junction device. In some embodiments, the integrated circuit device is a chip, microchip, integrated circuit, or other similar device. In some embodiments, the integrated circuit device (or corresponding device) forms part of a smart card.

In some embodiments, the outer substrate layer is made of a different material from the inner substrate layer, or is instead an outer layer made of a material other than a substrate, or is not present.

In some embodiments, the intermediate circuitry extends up to a front edge of the protective layer. In some embodiments, the intermediate circuitry extends at least partially into the protective layer. In some embodiments, the intermediate circuitry is at least partially situated proximal to an edge of the integrated circuit device. In some embodiments, the intermediate circuitry is situated in a plurality of locations of the inner substrate layer.

In some embodiments, the electrical property detected by the detection circuitry is a property other than capacitance, for example a measured current between two structures (equivalent to resistance). Another example is a measured logic state (e.g. an undamaged device corresponds to a 1, while a damaged device corresponds to a 0, thus changing the global reading value of a chain of devices).

In some embodiments, the integrated circuit device comprises a light detector in communication with the detection circuitry. In response to a detection of light by the light detector, the detection circuitry proceeds as set out above regarding the third embodiment (described with respect to FIG. 3). In other embodiments, no light detector is provided in the integrated circuit device.

In some embodiments, the protective layer is a doped layer that has a dopant concentration of at least $10^{19}$ cm$^{-3}$, $10^{20}$ cm$^{-3}$, $5 \times 10^{20}$ cm$^{-3}$, or $10^{21}$ cm$^{-3}$.

Having read the above description of specific embodiments and the preceding overview of aspects of the present disclosure, the skilled person will readily be aware that many modifications, juxtapositions, alterations and combinations of the features described above are possible and are covered by the scope defined by the claims that follow.

The invention claimed is:

1. An integrated circuit device comprising:
   a substrate having a first surface and a second surface opposite the first surface;
   a protected circuit disposed on the first surface of the substrate;
   a protective layer disposed within the substrate, between the first surface and the second surface, and configured to protect the protected circuit by absorbing laser radiation targeted at the protected circuit through the substrate, the protective layer being continuous over an entirety of the substrate; and
   an insulating layer disposed within the substrate, between the first surface and the protective layer in a cross sectional view, and configured to electrically insulate the protected circuit from the protective layer and a portion of the substrate that is on a side of the protective layer that is opposite the insulating layer.

2. The integrated circuit device as claimed in claim 1, wherein the protective layer is disposed such that removal of the protective layer causes physical damage to the protected circuit.

3. The integrated circuit device as claimed in claim 2, further comprising intermediate circuitry protruding into the substrate between the protective layer and the insulating layer, wherein the physical damage to the protected circuit is physical damage to the intermediate circuitry.

4. The integrated circuit device as claimed in claim 1, further comprising detection circuitry configured to detect a change in an electrical property of the integrated circuit device indicative of removal of the protective layer, and, in response to detecting the change in the electrical property, cause the protected circuit to be disabled.

5. The integrated circuit device as claimed in claim 4, wherein the electrical property is capacitance.

6. The integrated circuit device as claimed in claim 4, wherein the detection circuitry comprises a DRAM cell or a bipolar transistor.

7. The integrated circuit device as claimed in claim 4, further comprising intermediate detection circuitry protruding into the substrate between the protective layer and the protected circuit.

8. The integrated circuit device as claimed in claim 1, wherein the protective layer comprises a doped semiconductor.

9. The integrated circuit device as claimed in claim 8, wherein the doped semiconductor has a dopant concentration of $10^{19}$ cm$^{-3}$, $10^{20}$ cm$^{-3}$, $5 \times 10^{20}$ cm$^{-3}$ or $10^{21}$ cm$^{-3}$.

10. The integrated circuit device as claimed in claim 1, wherein the protective layer has a transmittance of the laser radiation that is less than or equal to one of 40%, 20%, 15%, 10%, 5%, or 2%.

11. The integrated circuit device as claimed in claim 1, wherein the laser radiation is infra-red radiation.

12. The integrated circuit device as claimed in claim 1, wherein the protective layer has a transmittance of the laser radiation that is less than a transmittance of the laser radiation of the substrate.

13. An integrated circuit device comprising:
   a protected circuit on a substrate;
   material within the substrate configured to protect the protected circuit by absorbing laser radiation targeted at the protected circuit through the substrate, the material being continuous over an entirety of the substrate;
   detection circuitry configured to detect a change in an electrical property of the device indicative of removal of the material from the substrate, and, in response to detecting the change in the electrical property, cause the protected circuit to be disabled; and
   an insulating layer disposed within the substrate, between the material and protected circuit in a cross sectional view, and configured to electrically insulate the protected circuit from the material and a portion of the substrate that is on a side of the material that is opposite the insulating layer.

14. An integrated circuit device comprising:
   a protected circuit on a substrate;
   material within the substrate configured to protect the protected circuit by absorbing laser radiation targeted at the protected circuit through the substrate, the material being continuous over an entirety of the substrate; and
   intermediate circuitry protruding into the substrate between the protected circuit and an insulating layer, the device being configured such that removal of the material from the substrate causes physical damage that disables the protected circuit;
   wherein the insulating layer is disposed within the substrate, between the material and protected circuit in a cross sectional view, and configured to electrically insulate the protected circuit from the material and a portion of the substrate that is on a side of the material that is opposite the insulating layer,
   wherein the physical damage that disables the protected circuit is physical damage to the intermediate circuitry.

* * * * *